(12) United States Patent
Chun

(10) Patent No.: US 9,111,594 B2
(45) Date of Patent: *Aug. 18, 2015

(54) SENSE AMPLIFIER STRUCTURE FOR A SEMICONDUCTOR INTEGRATED CIRCUIT DEVICE

(71) Applicant: SK hynix Inc., Icheon-si Gyeonggi-do (KR)

(72) Inventor: Duk Su Chun, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/493,499

(22) Filed: Sep. 23, 2014

(65) Prior Publication Data

US 2015/0009771 A1 Jan. 8, 2015

Related U.S. Application Data

(62) Division of application No. 13/181,889, filed on Jul. 13, 2011, now Pat. No. 8,872,277.

(30) Foreign Application Priority Data

Dec. 15, 2010 (KR) .................. 10-2010-0128006

(51) Int. Cl.
| | |
|---|---|
| *G11C 7/06* | (2006.01) |
| *H01L 27/108* | (2006.01) |
| *G11C 11/4091* | (2006.01) |
| *G11C 11/4094* | (2006.01) |
| *H01L 21/8234* | (2006.01) |
| *H01L 27/02* | (2006.01) |
| *G11C 7/12* | (2006.01) |
| *H01L 27/092* | (2006.01) |
| *H01L 21/8238* | (2006.01) |

(52) U.S. Cl.
CPC ...... *G11C 7/065* (2013.01); *G11C 7/12* (2013.01); *G11C 11/4091* (2013.01); *G11C 11/4094* (2013.01); *H01L 21/823418* (2013.01); *H01L 27/0207* (2013.01); *H01L 27/092* (2013.01); *H01L 27/10897* (2013.01); *H01L 21/823814* (2013.01)

(58) Field of Classification Search
CPC ............ H01L 27/10897; H01L 2027/10; G11C 7/06; G11C 7/065; G11C 2207/002; G11C 2207/06
USPC ........... 257/365, 368, 369, 401, E27.097; 365/189.05, 205, 207
See application file for complete search history.

(56) References Cited

U.S. PATENT DOCUMENTS

| | | | | |
|---|---|---|---|---|
| 6,438,042 | B1 * | 8/2002 | Kang et al. | 365/190 |
| 7,102,947 | B2 * | 9/2006 | Kajitani et al. | 365/205 |
| 7,768,853 | B2 * | 8/2010 | Ahn et al. | 365/203 |

\* cited by examiner

*Primary Examiner* — Allison P Bernstein
(74) *Attorney, Agent, or Firm* — William Park & Associates Ltd.

(57) ABSTRACT

A semiconductor integrated circuit device includes a first signal line and a second signal line, and a sense amplifier that includes a plurality of PMOS transistors and a plurality of NMOS transistors. The sense amplifier is configured to sense amplify a potential difference between the first signal line and the second signal line. The junction regions of the NMOS and PMOS transistors having the same conductivity type, and to which the same signal is applied, are formed in one integrated active region.

21 Claims, 9 Drawing Sheets

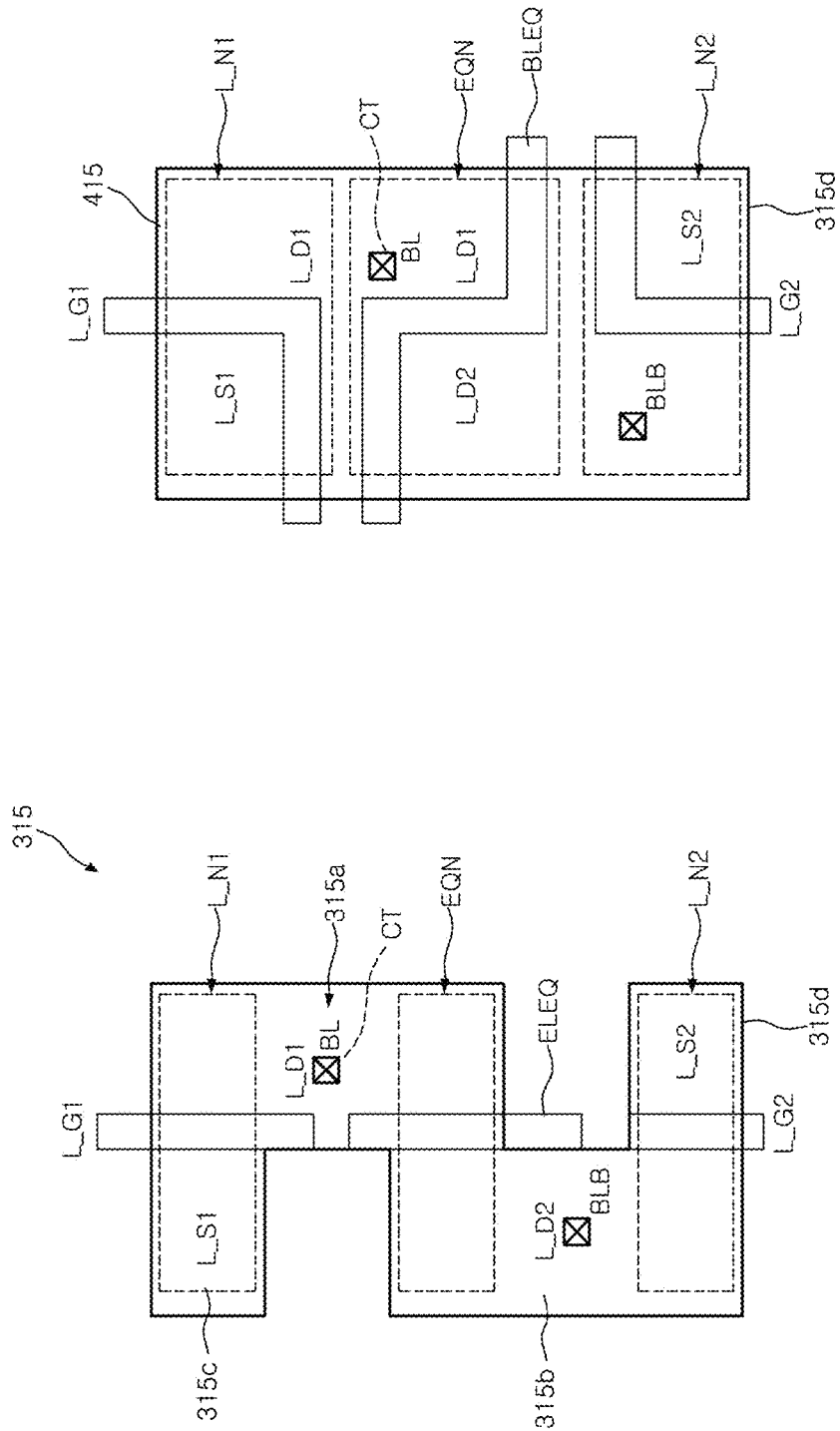

SENSE AMPLIFIER STRUCTURE FOR A SEMICONDUCTOR INTEGRATED CIRCUIT DEVICE

CROSS-REFERENCES TO RELATED APPLICATION

The present application claims priority under 35 U.S.C. 119(a) to Korean application number 10-2010-0128006, filed on Dec. 15, 2010 in the Korean Patent Office, and which is incorporated by reference in its entirety.

BACKGROUND OF THE INVENTION

1. Technical Field

Exemplary embodiments of the invention relate to a semiconductor integrated circuit device and, more particularly, to a sense amplifier structure of a semiconductor integrated circuit device.

2. Related Art

Dynamic random access memories (DRAMs) are typical semiconductor memory devices that use sense amplifiers to amplify data stored in memory cells. The sense amplifier is configured to connect to a bit line pair (bit line and bit line bar) connected to the memory cells and compare a charge-shared voltage level in the bit line pair with a bit line precharging voltage to discriminate the data of the memory cells.

A conventional sense amplifier includes a latch block, an equalization block, and a column selection block.

The latch block may be disposed between the bit line and the bit line bar and configured to connect PMOS transistors and NMOS transistors in a latch circuit. The equalization block is disposed between the bit line and the bit line bar and serves to make the bit line and the bit line bar to be equipotential in response to an equalization signal. The column selection block may be configured to switch the bit line and the bit line bar to a data transfer line in response to a column selection signal.

The latch block, equalization/precharge block, and column selection block all may be constituted of MOS transistors and gates, where sources and drains of the MOS transistors are appropriately coupled by metal interconnections to have the sense amplifier structure.

However, as the integration density in the semiconductor memory devices increases, distance between active regions becomes largely reduced, and line width of a metal interconnection and distance between metal interconnections are rapidly reduced.

Thus, RC delay of the metal interconnection is increased and coupling between adjacent metal interconnections makes it difficult to accurately transfer signals.

SUMMARY

According to one aspect of an exemplary embodiment, a semiconductor integrated circuit device includes a first signal line and a second signal line, and a sense amplifier that includes a plurality of NMOS transistors and a plurality of PMOS transistors. The sense amplifier is configured to sense-amplify a potential difference between the first signal line and the second signal line. Junction regions of MOS transistors having the same conductivity type, to which the same signal is applied, of the plurality of NMOS transistors and the plurality of PMOS transistors are integrated to share a portion of one active region.

These and other features, aspects, and embodiments are described below in the "DESCRIPTION OF EXEMPLARY EMBODIMENT" section.

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 12 is a diagram illustrating the N latch block and the equalization block of FIG. 11 according to an exemplary embodiment of the inventive concept;

FIG. 13 is a diagram illustrating the N latch block and the equalization block of FIG. 11 according to another exemplary embodiment of the inventive concept;

DESCRIPTION OF EXEMPLARY EMBODIMENT

Figure 1:
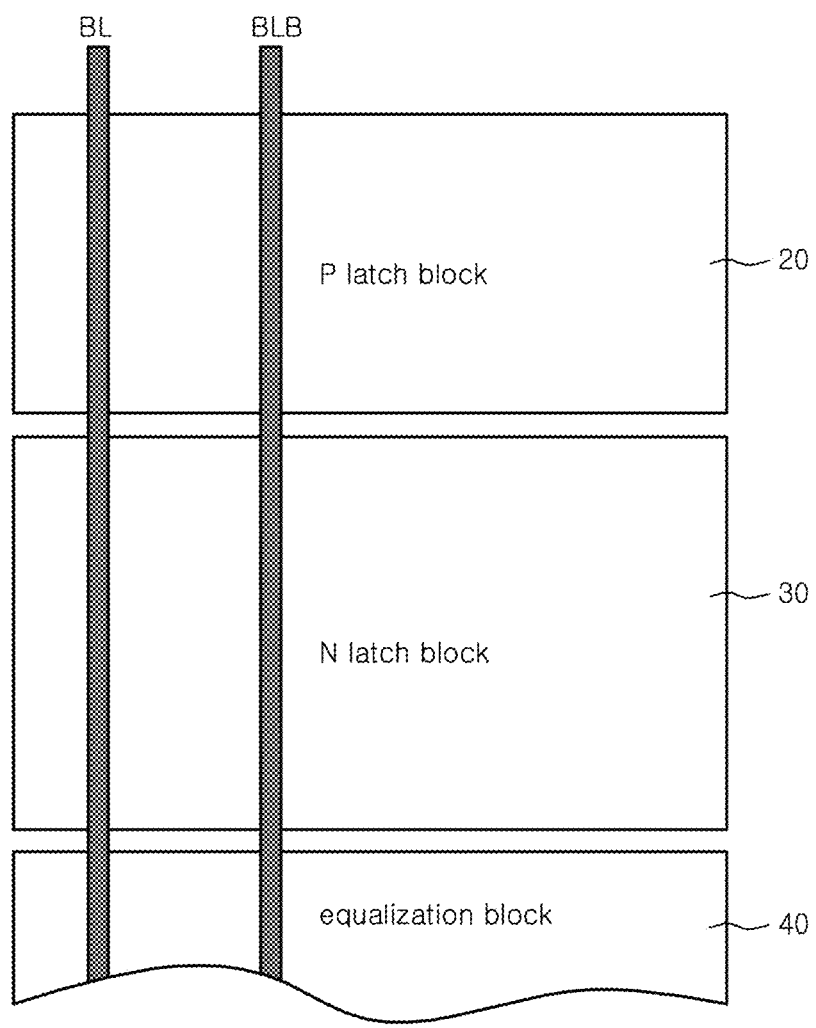
FIG. 1 is a plan view illustrating a sense amplifier of a semiconductor integrated circuit according to an exemplary embodiment of the inventive concept.

Exemplary embodiments are described with reference to cross-sectional illustrations that are schematic illustrations of the various exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated, but, rather, it may be understood that there may be deviations in shapes that result, for example, from manufacturing. In the drawings, lengths and sizes of layers and regions may be exaggerated for clarity. Like reference numerals in the drawings denote like elements. It is also understood that when a layer is referred to as being "on"

another layer or substrate, it can be directly on the other layer or substrate, or intervening layers may also be present.

In exemplary embodiments, at least two active regions having the same conductivity type, to which the same signal is applied to, may be integrated into one active region without discontinuity, and the integrated active region may be used as a common junction region. Accordingly, signal transmission may be performed through the active region without a separate interconnection connection. Thus, the number of interconnections for transmitting a signal between the active regions can be reduced so that interconnection redundancy and contact margin can be ensured.

Exemplary embodiments will describe a sense amplifier of a memory device. However, the exemplary embodiments are not limited thereto and may be applied to all semiconductor integrated circuit devices.

FIG. 1 is a schematic block diagram of a sense amplifier according to an exemplary embodiment of the inventive concept.

A sense amplifier 10 may comprise a P latch block 20, an N latch block 30, and an equalization block 40 sequentially arranged in directions of a bit line BL and a bit line bar BLB. The bit line bar BLB is a line for transmitting a signal having an opposite level to the bit line BL.

The P latch block 20 constitutes a pair of PMOS transistors connected between the bit line BL and the bit line bar BLB, and the N latch block 30 constitutes a pair of NMOS transistors connected between the bit line BL and the bit line bar BLB. The PMOS transistors constituting the P latch block 20 and the NMOS transistors constituting the N latch block 30 are appropriately electrically connected to form a CMOS inverter latch structure.

The equalization block 40 may be used to give the bit line BL and the bit line bar BLB the same bias level. The equalization block 40 may constitute a NMOS transistor between the bit line BL and the bit line bar BLB. The equalization block 40 may include a precharge circuit unit that precharges the bit line BL and the bit line bar BLB to the constant voltage.

In addition, the sense amplifier 10 may include a column selection block (not shown) that transfers signals of the bit line BL and the bit line bar BLB to an input/output (I/O) line in response to a column selection signal.

Figure 2:
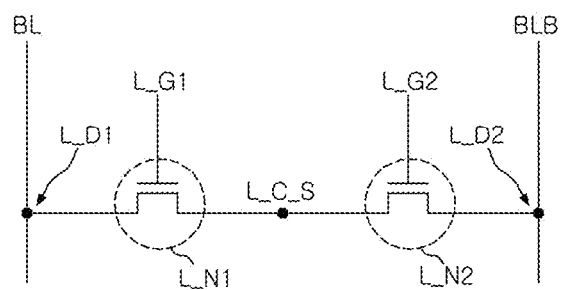
FIG. 2 is a circuit illustrating an N latch block of FIG. 1.

As shown in FIG. 2, the N latch block 30 may constitute a first NMOS transistor L_N1 and a second NMOS transistor L_N2 connected in series between the bit line BL and the bit line bar BLB.

The first NMOS transistor L_N1 includes a first drain L_D1 connected to the bit line BL, a gate connected to the first gate line L_G1, and a common source L_C_S. The second NMOS transistor L_N2 includes a second drain L_D2 connected to the bit line bar BLB, a gate connected to a second gate line L_G2, and the common source L_C_S.

Although not shown in drawings, the first gate line L_G1 may be electrically connected to a gate of one of the PMOS transistors in the P latch block 20 and also to the bit line bar BLB. Similarly, the second gate line L_G2 may be electrically connected to a gate of the other of the PMOS transistors in the P latch block 20 and the bit line BL.

Figure 3:
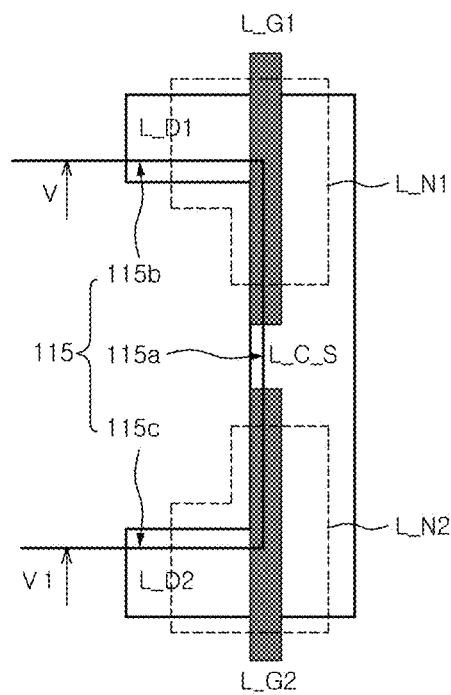
FIG. 3 is a diagram illustrating a layout of an N latch block according to an exemplary embodiment of the inventive concept.

In the N latch block 30 according to an exemplary embodiment shown in FIG. 3, the first NMOS transistor L_N1 and the second transistor L_N2 are integrated on one integrated active region 115. In this example, the active region is a well region surrounded by a device isolation layer and is interpreted as a junction region in which a source and a drain are to be formed after forming the gate lines.

The integrated active region 115 may include a body unit 115a substantially having a line shape and a pair of branch units 115b and 115c each extending from a respective edge of the body unit 115a. Although the branch units 115b and 115c are shown to extend in a direction substantially perpendicular to the body unit 115a, the branch units 115b and 115c may extend in another predetermined direction.

In an exemplary embodiment, the integrated active region 115 may have a first structure that includes a concave portion constituting a device isolation layer in one of the sidewalls of a rectangular active region. Accordingly, the integrated active region 115 may have at least, for example, two bent portions.

The first gate line L_G1 is formed along a direction so as to cross over an interface of the body unit 115a and the first branch unit 115b of the integrated active region 115. Similarly, the second gate line L_G2 is arranged along a direction so as to cross over an interface of the body unit 115a and the second branch unit 115c. The first gate line L_G1 and the second gate line L_G2 are electrically isolated from each other and, for example, may be arranged to be substantially parallel to each other.

The common source L_C_S may be formed on one side of the integrated active region 115 between the first and second gate lines L_G1 and L_G2, for example, along the body unit 115a, and the first and second drains L_D1 and L_D2 may be formed on the other side of the integrated active region 115, for example, along the first and second branch units 115b and 115c, respectively.

Figure 4:
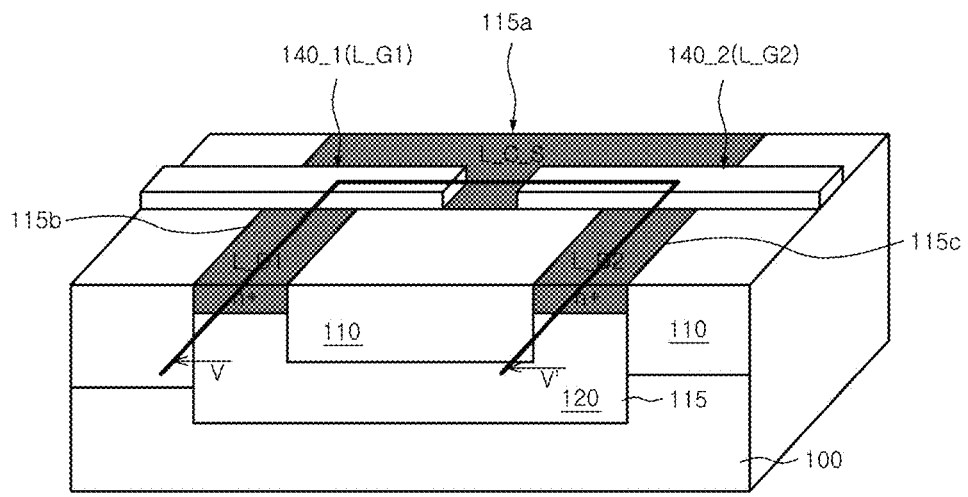
FIG. 4 is a perspective view of the N latch block of FIG. 3.
Figure 5:
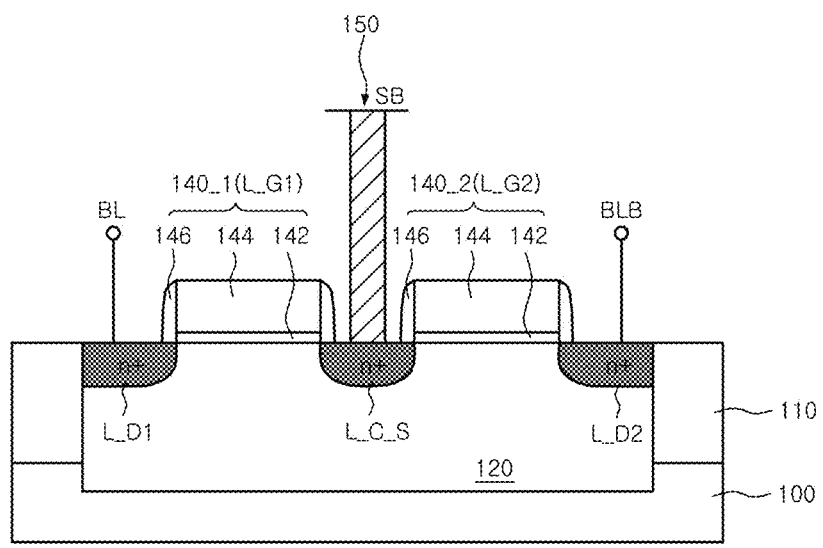
FIG. 5 is a cross-sectional view taken along the line V-V' of FIG. 3.

FIG. 4 is a perspective view of an N latch block according to an exemplary embodiment and FIG. 5 is a cross-sectional view of the N latch block taken along the line V-V' of FIG. 3.

Referring to FIGS. 4 and 5, the device isolation layer 110 is formed by a conventional method so that the integrated active region 115, including the body unit 115a and the first and second branch units 115b and 115c, is to be constructed in a predetermined portion of a semiconductor substrate 100. A p well 120 is formed in the integrated active region 115 by a conventional method.

The first gate line 140_1 (L_G1) having a predetermined line width is formed on the integrated active region 115 corresponding to the interface between the body unit 115a, and the first branch unit 115b and the second gate line 140_2 (L_G2) having a predetermined line width is formed on the integrated active region 115 corresponding to the interface between the body unit 115a and the second branch unit 115c. As shown in FIG. 5 in detail, each of the first and second gate lines 140_1 (LG_1) and 140_2 (LG_2) may include a gate insulating layer 142 formed on an upper surface of the semiconductor substrate 100, a gate conductive layer 144 formed on the gate insulating layer 142, and an insulating spacer 146 formed on a sidewall of the gate conductive layer 144.

The common source L_C_S and the first and second drains L_D1 and L_D2 are formed by implanting n-type impurities into the integrated active region 115 at both sides of the first and second gate lines 140_1 (LG_1) and 140_2 (LG_2).

A contact plug (not shown) in contact with the bit line BL is formed on the first drain L_D1 and a contact plug (not shown) in contact with the bit line bar BLB is formed on the second drain L_D2. In addition, one contact plug 150 in contact with a SB line is formed on the common source L_C_S (See FIG. 5).

In a related art, a source of a first NMOS transistor and a source of a second NMOS transistor were formed to be spaced apart from each other since respective active regions of the first and second NMOS transistors were formed to be separated and contact plugs for contacting with a SB line were arranged in the respective separated sources. Thus, it has to ensure the distance between the active regions constituting the first and second NMOS transistors along with an area of a contact plug and a distance between the contact plugs. However, in an exemplary embodiment, the sources of the NMOS transistors, to which the same voltage is applied, are commonly formed without discontinuity and wired through one contact (one contact plug). Accordingly, an undesired distance between the active regions (distance between the junction regions) can be reduced and it is unnecessary to form a plurality of contacts so that margins between interconnections and line width of the interconnection can be ensured.

Figure 6:
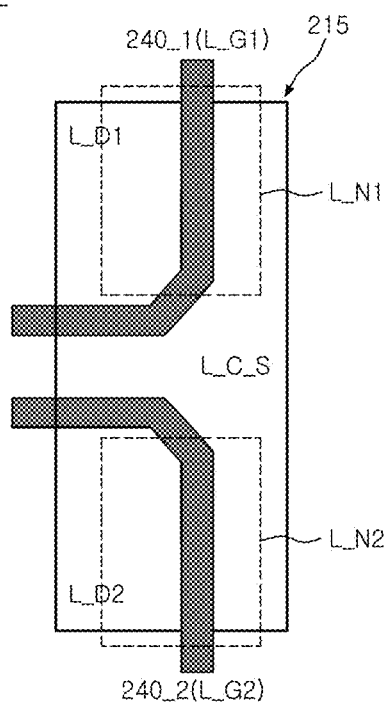
FIG. 6 is a diagram illustrating a layout of an N latch block according to another exemplary embodiment of the inventive concept.
Figure 7:
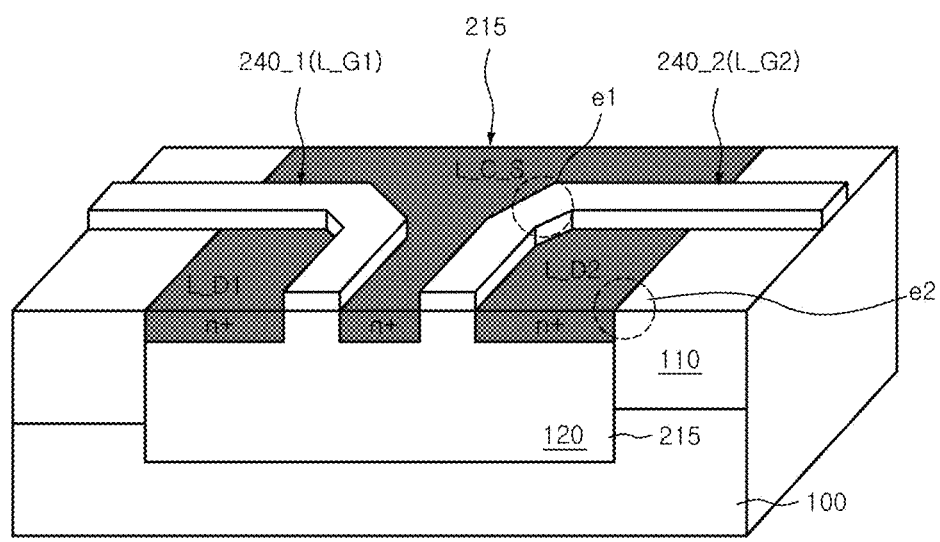
FIG. 7 is a perspective view of the N latch block of FIG. 6.

In addition, as shown in FIGS. 6 and 7, an integrated active region 215 of the N latch block 30 may be, for example, substantially in a rectangular shape. Each of the first and second gate lines 240_1 (L_G1) and 240_2 (L_G2) may be arranged on different portions of the integrated active region 215 so that the first and second drains L_D1 and L_D2, which are respectively connected to the bit line BL and the bit line bar BLB, are electrically separated. In an exemplary embodiment shown in FIG. 7, the first and second gate lines 240-1 (L_G1) and 240-2 (L_G2) are formed so that each edge e1 of the first and second gate lines 240-1 (L_G1) and 240-2 (L_G2) face a corresponding edge e2 of the active region 120. That is, in an exemplary embodiment, the first and second gate lines 240_1 (L_G1) and 240_2 (L_G2) may have a symmetrical shape and for example, have an L-shaped structure.

The NMOS transistors are formed by implanting n-type impurities in the integrated active region 215 at both sides of the first and second gate lines 240_1 (L_G1) and 240_2 (L_G2), thereby constituting the N latch block 30.

In an exemplary embodiment shown in FIG. 4, when the integrated active region 115 is constituted in a bent shape, the first and second gate lines 140_1 (L_G1) and 140_2 (L_G2) are arranged along a line to divide the respective NMOS transistors. Alternatively, as shown in FIGS. 6 and 7, the first and second gate lines 240_1 (L_G1) and 240_2 (L_G2) are bent to divide the NMOS transistors.

Figure 8:
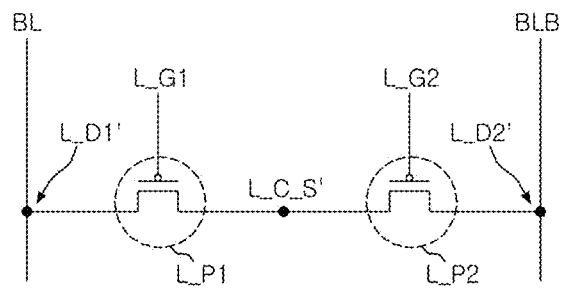
FIG. 8 is a circuit diagram illustrating a P latch block of FIG. 1.

FIG. 8 is a circuit diagram illustrating a P latch block according to an exemplary embodiment of the inventive concept.

As shown in FIG. 8, the P latch block 20 may constitute a first PMOS transistor L_P1 and a second PMOS transistor L_P2 connected in series between the bit line BL and the bit line bar BLB.

The first PMOS transistor L_P1 includes a first drain L_D1' connected to the bit line BL, a gate connected to the first gate line L_G1, and a common source L_C_S'. The second PMOS transistor L_P2 includes a second drain L_D2' connected to the bit line bar BLB, a gate connected to the second gate line L_G2, and the common source L_C_S'.

The first PMOS transistor L_P1 is connected to the first NMOS transistor L_N1 in an inverter configuration so that the first gate line L_G1 is connected to the bit line bar BLB. The second PMOS transistor L_P2 is connected to the second NMOS transistor L_N2 in an inverter configuration so that the second gate line L_G2 is connected to the bit line BL. Accordingly, an inverter latch may be formed from the transistors L_P1, L_P2, L_N1, and L_N2.

Figure 9:
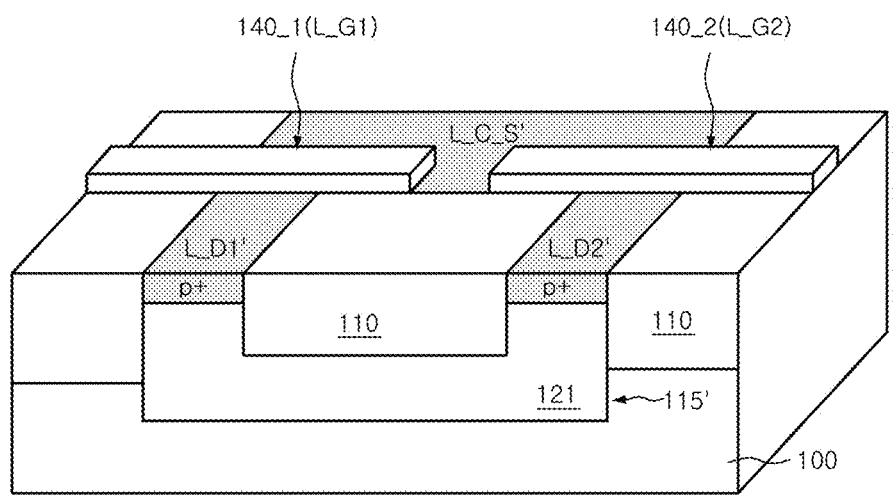
FIG. 9 is a perspective view of a P latch block according to an exemplary embodiment of the inventive concept.
Figure 10:
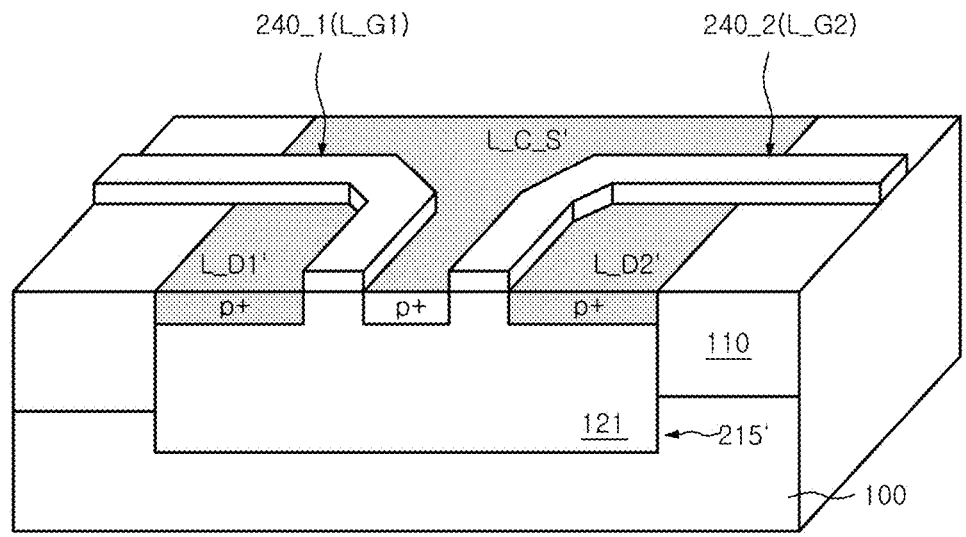
FIG. 10 is a perspective view of a P latch block according to another exemplary embodiment of the inventive concept.

The P latch block may be arranged in the integrated active region 115' having a shape as shown in FIG. 9. Alternatively, the P latch block 20 may be formed in the integrated active region 215' having a shape similar to the N latch block 30, as shown in FIG. 10.

A PMOS transistor is formed by forming an N well 121 in the integrated active region 115' or 215' and implanting p-type impurities in the integrated active region 115' or 215' at both sides of the first and second gate line 140_1 (L_G1) and 140_2 (L_G2) or 240_1 (L_G1) and 240_2 (L_G2). Since the methods of forming the N latch block 30 and the P latch block 20 are almost the same, repeated description will be omitted for the remainder of forming the P latch block 20.

Figure 11:
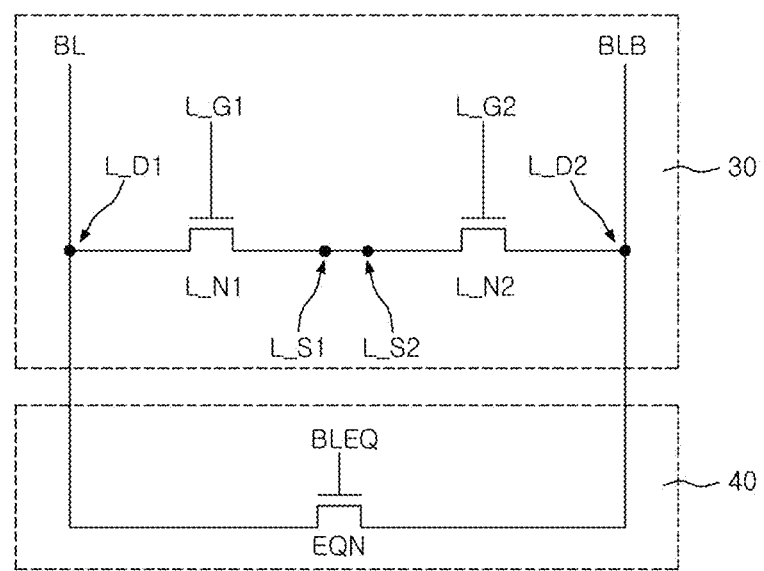
FIG. 11 is a circuit diagram illustrating an N latch block and equalization block of FIG. 1.

Referring to FIG. 11, the equalization block 40 may comprise an NMOS transistor EQN connected between the bit line BL and the bit line bar BLB and driven by an equalization signal line BLEQ at the gate of the NMOS transistor EQN. The N latch block 30 and the equalization block 40 may be in one integrated active region.

Thus, as shown in FIG. 12, an integrated active region 315 may include a first body unit 315a, a second body unit 315b, a first branch unit 315c and a second branch unit 315d so that the integrated active region 315 has at least one bent portion. The first and second body units 315a and 315b are arranged to be parallel to each other with portions of the first and second body units 315a and 315b being in contact with each other. For example, the first body unit 315a and second body unit 315b are arranged so that one side portion of the first body unit 315a is in contact with a side portion of the second body unit 315b. The first branch part 315c extends from another side portion of the first body unit 315a in a direction perpendicular to a longitudinal direction of the first body unit 315a and the second branch unit 315d extends from one side portion of the second body unit 315b in a direction perpendicular to a longitudinal direction of the second body unit 315b. The first branch unit 315c and the second body unit 315b are spaced at a predetermined distance and the second branch unit 315d and the first body unit 315a are spaced at a predetermined distance. Accordingly, the integrated active region 315, in which the N latch block 30 and the equalization block 40 may be formed, may have, for example, an S-shaped structure.

The first gate line L_G1 may be arranged in a line shape on an interface between the first body unit 315a and the first branch unit 315c and the second gate line L_G2 may be arranged in a line shape on an interface between the second body unit 315b and the second branch unit 315d. The equalization signal line BLEQ may be arranged as a straight line on an interface between the first body unit 315a and the second body unit 315b. The first gate line L_G1, the second gate line L_G2, and the equalization signal line BLEQ may be arranged to be aligned in a row and may be electrically isolated from each other.

N-type impurities are implanted into the integrated active region 315 at both sides of the first gate line L_G1, the second gate line L_G2, and the equalization signal line BLEQ so that the first body unit 315a becomes a first drain L_D1 in contact with the bit line BL, the first branch unit 315c becomes a first source L_S1, the second body unit 315b is a second drain L_D2 in contact with the bit line bar BLB, and the second branch unit 315d is a second source L_S2. The symbol CT denotes a contact unit or a contact plug.

The first NMOS transistor L_N1 of the N latch block 30 is formed between the first gate line L_G1, the first branch unit 315c, and the first body unit 315a. The second NMOS transistor L_N2 of the N latch block 30 is formed between the second gate line L_G2, the first body unit 315a, and the second body unit 315b. The equalization transistor EQN of the equalization block 40 is formed between the equalization signal line BLEQ, the second body unit 315b, and the second branch unit 315d.

As shown in FIG. 13, the N latch block 30 and the equalization block 40 may also be integrated in an integrated active region 415 having a rectangular shape. In this case, in order to form the first and second NMOS transistors L_N1 and L_N2 and the equalization transistor EQN, the first and second gate lines L_G1 and L_G2 may be structured at diagonally opposite corners of the integrated active region 415. The equalization signal line BLEQ may be formed to cross over the integrated active region 415 between the first and second gate lines L_G1 and L_G2, and for example, arranged as shown to divide the integrated active region 415 in two. N-type impurities are implanted into the integrated active region 415 at both sides of the first gate line L_G1, the second gate line L_G2, and the equalization signal line BLEQ to appropriately form the first and second NMOS transistors L_N1 and L_N2 of the N latch block 30 and the equalization transistor EQN of the equalization block.

In an exemplary embodiment, when the N latch block 30 and the equalization block 40 are integrated in the integrated active region 315 or 415, the first and second drains LD_1 and LD_2 are commonly formed in the respective integrated active region 315 or 415 so that a distance between the active regions and an area between the bit line contact and the bit line bar contact can be reduced.

Figure 14:
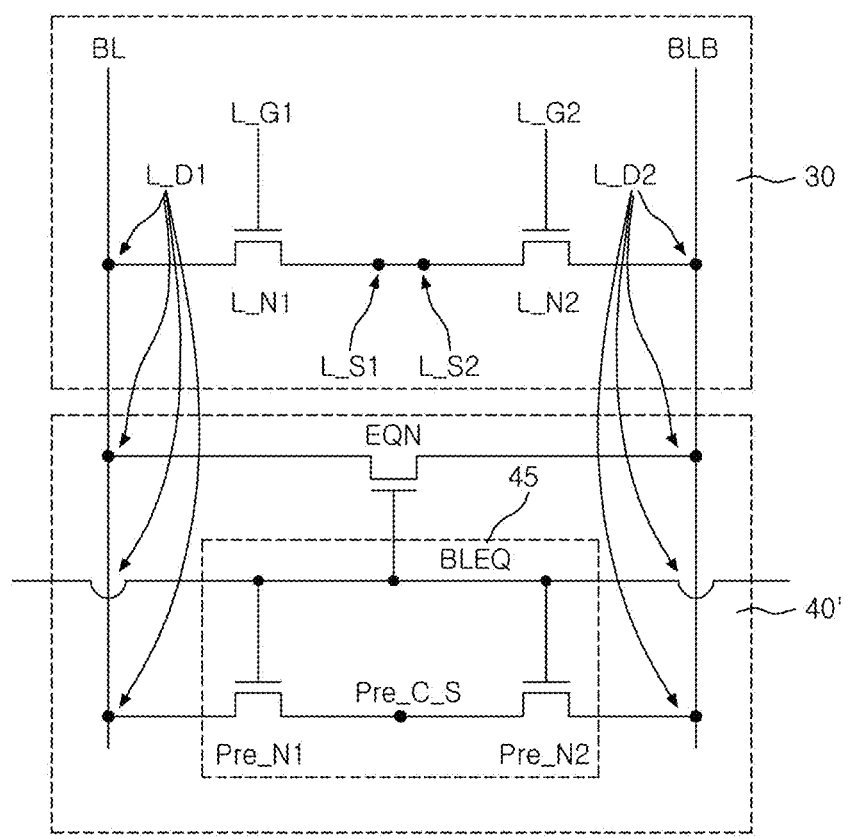
FIG. 14 is a circuit diagram an N latch block and an equalization block including a precharge circuit unit of FIG. 1.

As shown in FIG. 14, the equalization block 40' may further include a precharge circuit unit 45 in addition to the equalization transistor EQN. The precharge circuit unit 45 may include a first NMOS precharge transistor Pre_N1 and a second NMOS precharge transistor Pre_N2 connected in series between the bit line BL and the bit line bar BLB. The first NMOS precharge transistor Pre_N1 is driven by the equalization signal line BLEQ and is connected between the bit line BL and the second NMOS precharge transistor Pre_N2. The second NMOS precharge transistor Pre_N2 is also driven by the equalization signal line BLEQ and is connected between the first NMOS precharge transistor Pre_N1 and the bit line bar BLB.

Figure 15:
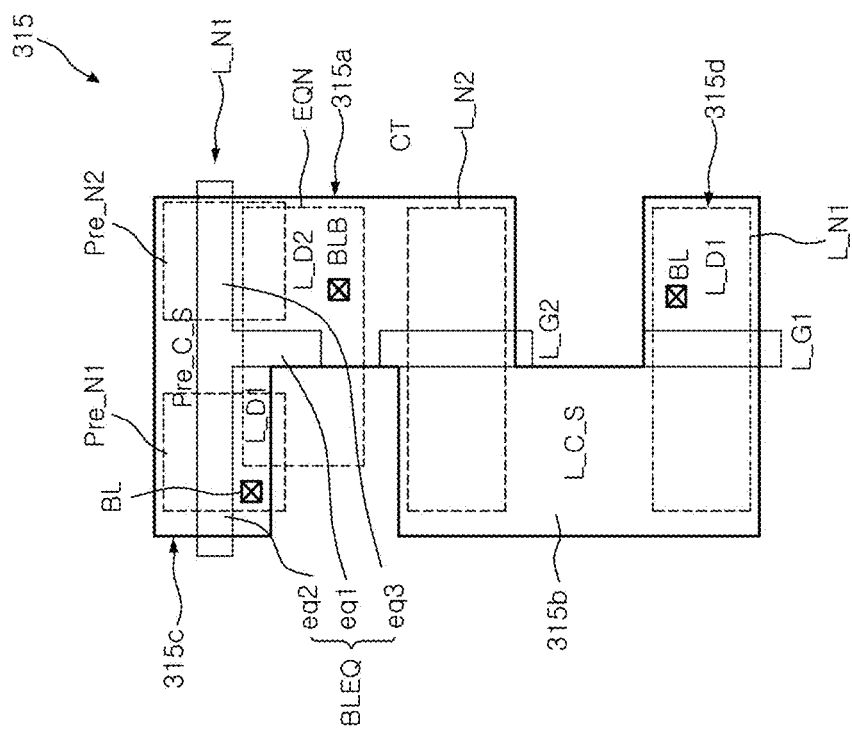
FIG. 15 is a diagram illustrating a layout of the N latch block and the equalization block including the precharge circuit unit of FIG. 14 according to an exemplary embodiment of the inventive concept.

As illustrated in FIG. 15, the equalization block 40' including the precharge circuit unit 45 of FIG. 14 and the N latch block 30 may also be integrated in one integrated active region 315. The integrated active region 315 may have the same structure as the integrated active region 315 of FIG. 12 as described above and, therefore, repeated description will be omitted.

Referring to FIG. 15, an equalization signal line BLEQ is arranged on the integrated active region 315 including a plurality of bent portions. The equalization signal line BLEQ may include a first signal line eq1 arranged on an interface between the first body unit 315a and the first branch unit 315c, a second signal line eq2 extending from one side edge of the first signal line eq1 to the first branch unit 315c, and a third signal line eq3 extending from the one side edge of the first signal line eq1 to the first body unit 315a. The first signal line eq1 may be a gate of the equalization transistor EQN, the second signal line 2q2 may be a gate of the first NMOS precharge transistor Pre_N1, and the third signal line eq3 may be a gate of the second NMOS precharge transistor Pre_N2. As can be seen, the equalization signal line BLEQ including the first to third signal lines eq1 to eq3 may substantially have a T-shaped structure.

The first gate line L_G1 of the first NMOS transistor L_N1 of the N latch block 30 is arranged in an interface between the first body unit 315a and the second body unit 315b, and the second gate line L_G2 of the second NMOS transistor L_N2 of the N block latch 30 is arranged in an interface between the second body unit 315b and the second branch unit 315d.

The signal line eq1 of the equalization signal line BLEQ, the first gate line L_G1, and the second gate line L_G2 are arranged on the integrated active region 315 to be aligned in a row and are electrically isolated from each other.

N-type impurities are implanted into the integrated active region 315 at both sides of the first gate line L_G1, the second gate line L_G2, and the equalization signal line BLEQ. A common precharge source region Pre_C_S is formed in the first body unit 315a and the first branch unit 315c at one side of the second and third signal lines eq2 and eq3, and a drain region LD_1 in contact with the bit line BL is formed in the first branch unit 315c corresponding to the other side of the second signal line eq2. A common drain L_D2 in contact with the bit line bar BLB is constructed in a portion of the first body unit 315a bounded by the third signal line eq3, the first signal line eq1, and the second gate line L_G2. A common source L_C_S of the first and second NMOS transistors L_N1 and L_N2 of the N latch block 30 is constructed in a portion of the second body unit 315b bounded by the second gate line L_G2 and the first gate line L_G1. A drain LD_1, which is to be in contact with the bit line BL, is formed in the second branch unit 315d at one side of the first gate line L_G1. Accordingly, the equalization block 40' including the precharge circuit unit 45 and the N latch block 30 may be constructed within the integrated active region 315 without discontinuity.

Figure 16:
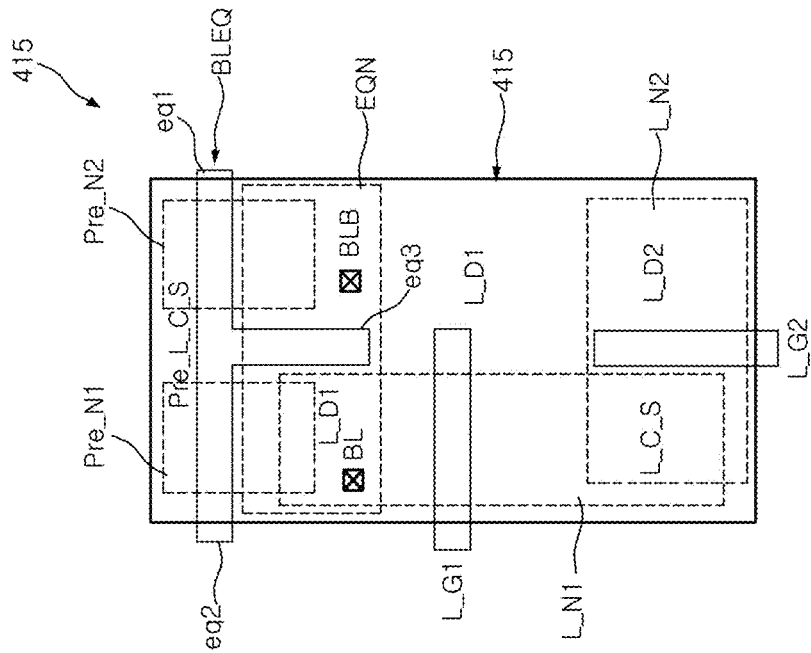
FIG. 16 is a diagram illustrating a layout of the N latch block and the equalization block including the precharge circuit unit of FIG. 14 according to another exemplary embodiment of the inventive concept

Similarly, as shown in FIG. 16, the equalization block 40' including the precharge circuit unit 45 and the N latch block 30 may be integrated within an integrated active region 415 having a rectangular shape. In this case, the equalization signal line BLEQ is formed in the same T-shaped structure as in FIG. 15, the first gate line L_G1 is arranged in the center of the integrated active region 415 in parallel to first and second signal lines eq1 and eq2 of the equalization signal line BLEQ, and the second gate line L_G2 is arranged to be substantially aligned with the third signal line eq3 of the equalization signal line BLEQ in a row. Accordingly, the first NMOS precharge transistor Pre_N1 is formed near the second signal line eq2 of the equalization signal line BLEQ, the second NMOS precharge transistor Pre_N2 is formed near the first signal line eq1 of the equalization signal line BLEQ, and the equalization transistor EQN is formed near the third signal line eq3 of the equalization signal line BLEQ. In addition, the first NMOS transistor L_N1 of the N latch block 30 is formed on both sides of the first gate line L_G1 and the second NMOS transistor L_N2 of the N latch block 30 is formed on both sides of the second gate line L_G2.

According to an exemplary embodiment, the N latch block 30 and the equalization block 40' including a precharge circuit unit can also be designed and integrated in the integrated active region 315 or 415 so that at least one junction region is common.

As described above, according to an exemplary embodiment, junction regions having the same conductivity type, to which the same line or the same signal is applied, are constructed on integrated active region in the sense amplifier of the semiconductor integrated circuit device. A distance between the active regions can then be reduced and a signal can be transmitted to the integrated active region through one contact so that the contact margin can be ensured without using a plurality of contacts.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:
1. A semiconductor integrated circuit device, comprising:
a first signal line and a second signal line; and
a sense amplifier that includes a plurality of NMOS transistors and a plurality of PMOS transistors, and is configured to sense-amplify a potential difference between the first signal line and the second signal line, wherein junction regions of the PMOS and NMOS transistors having the same conductivity type to which a same signal is applied are integrated to share a portion of one active region, and the sense amplifier includes a latch block, wherein the latch block includes:

a first gate line arranged to partition one portion of the integrated active region;

a second gate line arranged to partition another portion of the integrated active region; and an equalization block arranged between the first gate line and the second gate line.

2. The semiconductor integrated circuit device of claim 1, wherein the latch block includes:

an N latch block including a pair of the NMOS transistors connected in series between the first signal line and the second signal line by their sources; and a P latch block including a pair of the PMOS transistors connected in series between the first signal line and the second signal line by their sources, wherein the pair of PMOS transistors and the pair of NMOS transistors are configured as an inverter latch;

wherein the equalization block is connected between the first signal line and the second signal line.

3. The semiconductor integrated circuit device of claim 2, wherein the pair of NMOS transistors constituting the N latch block are integrated to share a common source in a first integrated active region without discontinuity.

4. The semiconductor integrated circuit device of claim 1, wherein the integrated active region has a rectangular shape.

5. The semiconductor integrated circuit device of claim 4, wherein the first gate line is bent to bound a first portion of the integrated active region and the second gate line is bent to bound a second portion of the integrated active region.

6. The semiconductor integrated circuit device of claim 5, wherein a first drain is formed in the first portion of the integrated active region bounded by the first gate line, a second drain is formed in the second portion of the integrated active region bounded by the second gate line, and a common source is formed in the integrated active region other than the first and second portions.

7. The semiconductor integrated circuit device of claim 2, wherein the pair of PMOS transistors constituting the P latch block is arranged to share a common source within a second integrated active region without discontinuity.

8. The semiconductor integrated circuit device of claim 2, wherein the equalization block includes an NMOS equalization transistor connected to the first and second signal lines, wherein the NMOS equalization transistor is driven by a signal on an equalization signal line.

9. The semiconductor integrated circuit device of claim 8, wherein the N latch block and the equalization block are formed in one integrated active region without discontinuity.

10. The semiconductor integrated circuit device of claim 9, wherein a portion of NMOS transistors in contact with the first signal line, wherein the NMOS transistors constitute the N latch block, is connected to a drain of the NMOS equalization transistor, and a portion of the NMOS transistors in contact with the second signal line, wherein the NMOS transistors constitute the N latch block, is connected to a source of the NMOS equalization transistor.

11. The semiconductor integrated circuit device of claim 10, wherein the integrated active region, in which the N latch block and the equalization block are integrated, includes:

a first body unit arranged in a line shape;

a second body unit in contact with of one side portion of a first side surface of the first body unit and arranged in parallel to the first body unit;

a first branch unit extending in a direction substantially perpendicular to the body unit from the other side portion of the first side surface of the first body unit; and a second branch unit extending from one side portion of the second side surface of the second body unit, which is in contact with the first body unit and faces the first side surface, in a direction substantially perpendicular to the second body unit.

12. The semiconductor integrated circuit device of claim 11, wherein the integrated active region further includes:

a first gate line arranged in an interface between the first body unit and the first branch unit;

a second gate line aligned substantially in a row with the first gate line and arranged on an interface between the second body unit and the second branch unit; and an equalization signal line aligned substantially in a row with the first and second gate lines, electrically isolated from the first and second gate lines, and arranged on an interface between the first body unit and the second body unit.

13. The semiconductor integrated circuit device of claim 12, wherein a first junction region, which is in contact with the first signal line, is formed in the integrated active region at one side of the first gate line and the equalization signal line, and a second junction region, which is in contact with the second signal line, is formed in the integrated active region at the other side of the equalization signal line and the second gate line.

14. The semiconductor integrated circuit device of claim 10, wherein the N latch block and the equalization block includes:

a first gate line arranged to partition one portion of the integrated active region;

a second gate line arranged to partition another portion of the integrated active region; and an equalization signal line electrically isolated from the first and second gate lines and formed in the integrated active region between the first and second gate lines.

15. The semiconductor integrated circuit device of claim 14, wherein the integrated active region is configured in a rectangular shape.

16. The semiconductor integrated circuit device of claim 15, wherein the first gate line partitions a first portion of the integrated active region, and the second gate line partitions a second portion of the integrated active region, and the equalization signal line is constituted to substantially cross over the integrated active region between the first and second gate lines.

17. The semiconductor integrated circuit device of claim 16, wherein portions of the integrated active region partitioned by the respective first and second gate lines are respective sources of the pair of NMOS transistors constituting the N latch block.

18. The semiconductor integrated circuit device of claim 2, wherein the sense amplifier further includes a precharge circuit unit comprising a pair of NMOS transistors connected in series, driven by an equalization signal between the first and second signal lines.

19. The semiconductor integrated circuit device of claim 18, wherein the N latch block, the equalization block, and the precharge circuit unit are integrated in one integrated active region without discontinuity.

20. The semiconductor integrated circuit device of claim 19, wherein in the N latch block, the equalization block, and the precharge circuit unit:
- sources of the pair of NMOS transistors constituting the N latch block are formed in the one integrated active region without discontinuity,
- sources of the pair of NMOS transistors constituting the precharge circuit unit are formed in one of the integrated active region without discontinuity, and
- portions of the N latch block, the equalization block, and the precharge circuit unit, which are in contact with the second signal line, are commonly formed.

21. The semiconductor integrated circuit device of claim 1, wherein the first signal line is a bit line and the second signal line is a bit line bar.

* * * * *